(12) United States Patent
Kim

(10) Patent No.: US 12,356,547 B2
(45) Date of Patent: Jul. 8, 2025

(54) PRINTED CIRCUIT BOARD

(71) Applicant: SAMSUNG ELECTRO-MECHANICS CO., LTD., Suwon-si (KR)

(72) Inventor: Man Gon Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 182 days.

(21) Appl. No.: 18/104,052

(22) Filed: Jan. 31, 2023

(65) Prior Publication Data
US 2024/0074057 A1 Feb. 29, 2024

(30) Foreign Application Priority Data

Aug. 23, 2022 (KR) .................. 10-2022-0105672
Sep. 30, 2022 (KR) .................. 10-2022-0124825

(51) Int. Cl.
*H05K 1/00* (2006.01)
*H05K 1/11* (2006.01)

(52) U.S. Cl.
CPC ... *H05K 1/116* (2013.01); *H05K 2201/09481* (2013.01); *H05K 2201/096* (2013.01); *H05K 2201/09827* (2013.01)

(58) Field of Classification Search
CPC ......... H05K 1/116; H05K 2201/09481; H05K 2201/096; H05K 2201/09827
See application file for complete search history.

(56) References Cited

U.S. PATENT DOCUMENTS

| 2009/0242261 A1* | 10/2009 | Takenaka | H05K 1/0271 174/262 |
| 2010/0263923 A1* | 10/2010 | Kodani | H01L 23/49811 29/846 |
| 2010/0307809 A1* | 12/2010 | Noda | H05K 3/4602 29/829 |
| 2013/0250533 A1* | 9/2013 | Kodani | H05K 1/181 361/767 |
| 2014/0054068 A1* | 2/2014 | Kato | H05K 3/4602 156/60 |
| 2021/0127496 A1* | 4/2021 | Tuominen | H05K 3/0032 |

FOREIGN PATENT DOCUMENTS

KR 10-2021-0070012 A 6/2021

\* cited by examiner

*Primary Examiner* — Pete T Lee
(74) *Attorney, Agent, or Firm* — MORGAN, LEWIS & BOCKIUS LLP

(57) ABSTRACT

A printed circuit board includes a first insulating layer; a through-hole penetrating a region between an upper surface and a lower surface of the first insulating layer; a first via disposed in at least a portion of the through-hole; a first pad connected to an upper side of the first via; and a second pad connected to a lower side of the first via. A width of the through-hole on an uppermost side is greater than a width of the first pad. At least a portion of an upper surface of the first via exposed from the first pad is recessed below the upper surface of the first insulating layer.

22 Claims, 9 Drawing Sheets

A-A'

(a)

(b)

B-B'

PRINTED CIRCUIT BOARD

CROSS-REFERENCE TO RELATED APPLICATIONS

This application claims benefit of priority to Korean Patent Application No 10-2022-0105672 filed on Aug. 23, 2022 and Korean Patent Application No. 10-2022-0124825 filed on Sep. 30, 2022 in the Korean Intellectual Property Office, the disclosures of which are incorporated herein by reference in their entirety.

TECHNICAL FIELD

The present disclosure relates to a printed circuit board.

BACKGROUND

Recently, the number of circuits and vias for signal transmission in a substrate has increased rapidly due to high performance of electronic devices, and accordingly, a substrate having multiple layers and large-area has been necessary. For example, as the number of signal transfer circuits has rapidly increased, a design of vias and circuits has increased, and accordingly, as an area of a substrate has increased, the number of layers of the substrate has increased.

To reduce an area of a substrate and to reduce the number of layers, it may be necessary to increase integration density by reducing a size of a via together with implementation of a microcircuit, but there may still be a limitation in reducing the scale in a core insulating layer of the substrate.

SUMMARY

An aspect of the present disclosure is to provide a printed circuit board which may, by increasing integration density, reduce an area thereof and may reduce the number of layers.

Another aspect of the present disclosure is to provide a printed circuit board which may improve reliability of through-vias formed in a core insulating layer.

An aspect of the present disclosure is to form a width of an uppermost side and/or a lowermost side of a through-hole formed in a core insulating layer to be wider than a width of a pad of a through-via filling a through-hole, and to allow at least a portion of an upper surface and/or a lower surface of the through-via by forming a groove portion on an uppermost side and/or lowermost side of the through-via.

According to an aspect of the present disclosure, a printed circuit board includes a first insulating layer; a through-hole penetrating a region between an upper surface and a lower surface of the first insulating layer; a first via disposed in at least a portion of the through-hole; a first pad connected to an upper side of the first via; and a second pad connected to a lower side of the first via. A width of the through-hole on an uppermost side is greater than a width of the first pad. At least a portion of an upper surface of the first via exposed from the first pad is recessed below an upper surface of the first insulating layer.

Another aspect of the present disclosure is to form a width of an uppermost side and/or a lowermost side of a through-hole formed in a core insulating layer to be wider than a width of a pad of a through-via filling a through-hole, and to form a width of a pad of the through-via to be wider than a width of a pad of a connection via filling a via hole formed in a build-up insulating layer.

According to an aspect of the present disclosure, a printed circuit board includes a core insulating layer; a through-via disposed in at least a portion of a through-hole penetrating through the core insulating layer; a first pad connected to an upper side of the through-via; a second pad connected to a lower side of the through-via; a first build-up insulating layer disposed on an upper surface of the core insulating layer and covering at least a portion of the first pad; a first connection via disposed in at least a portion of a first via hole penetrating through the first build-up insulating layer; and a third pad connected to an upper side of the first connection via. A width of the through-hole on the uppermost side is greater than a width of the first pad. A width of the first pad is greater than a width of the third pad.

According to an aspect of the present disclosure, a printed circuit board a first insulating layer; a hole penetrating a region between an upper surface and a lower surface of the first insulating layer; a first via disposed in at least a portion of the hole; and a first pad disposed on the first via. On the upper surface of the first insulating layer, a width of the first pad is the same as a width of the first via and less than a width of the hole.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
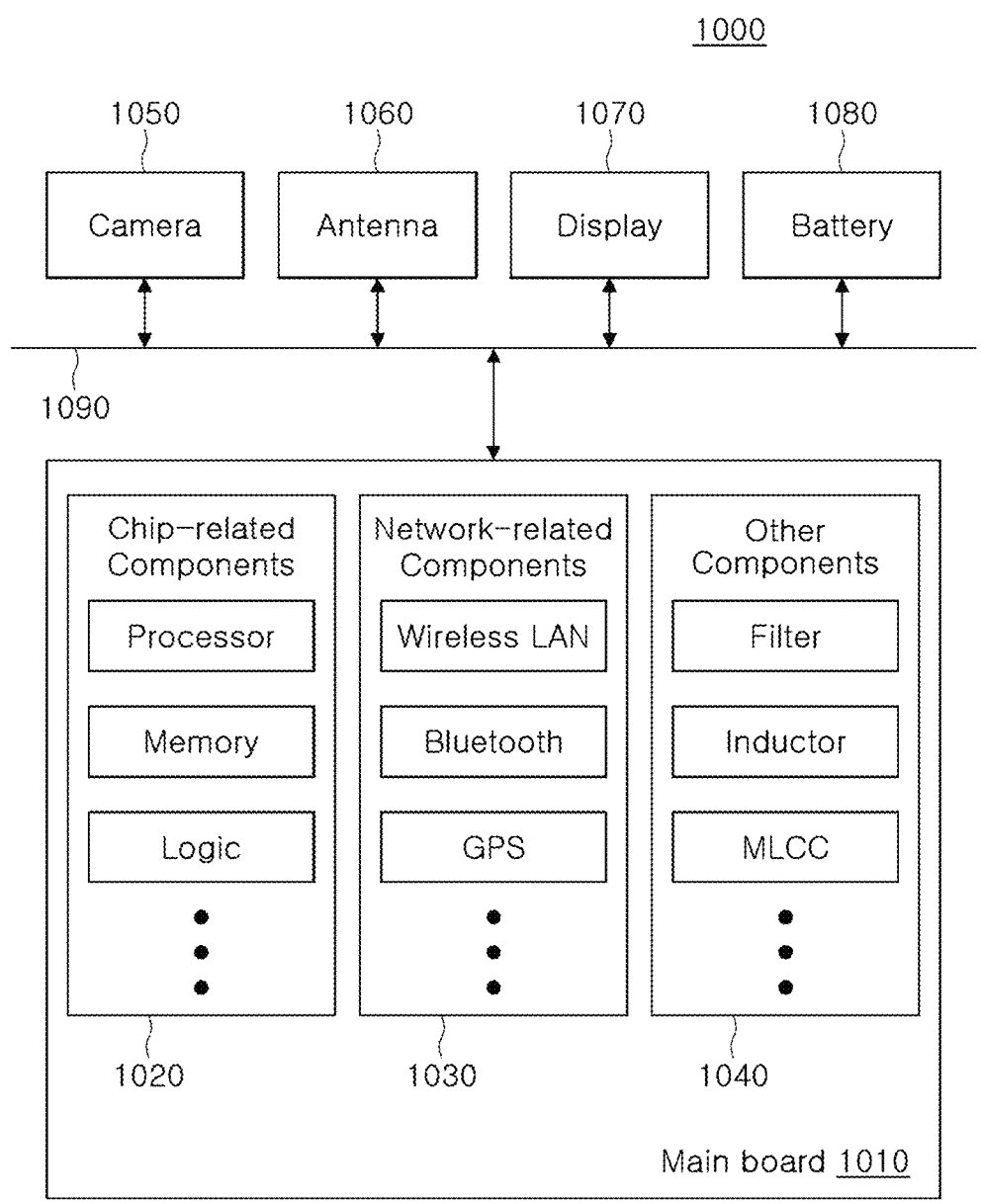
FIG. 1 is a block diagram illustrating an example of an electronic device system.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. Also, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. Also, the network related components 1030 may be combined with each other, together with the chip related components 1020 described above.

Depending on a type of the electronic device 1000, the electronic device 1000 may include other components that may or may not be physically or electrically connected to the mainboard 1010. The other components may include, for example, a camera module 1050, an antenna module 1060, a display 1070, and a battery 1080. However, the other components are not limited thereto, and may include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. The other components may also include other components used for various purposes depending on a type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
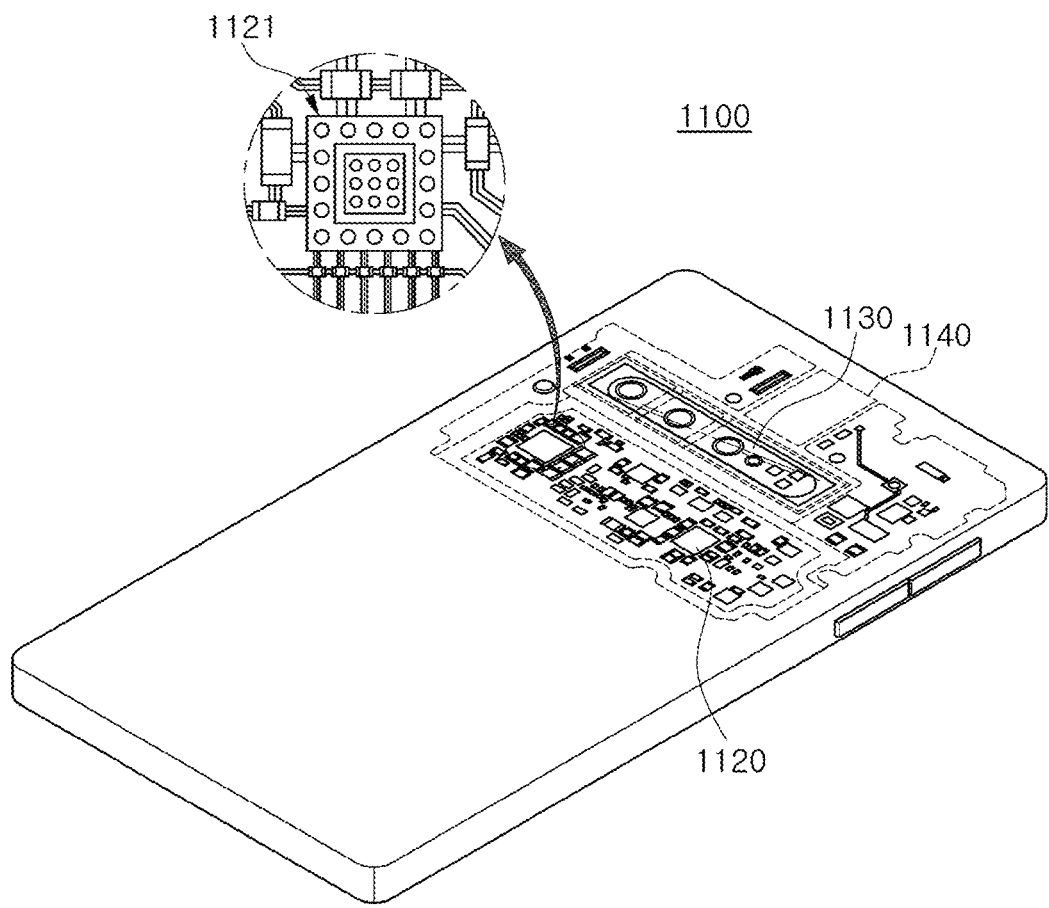
FIG. 2 is a perspective diagram illustrating an example of an electronic device.

FIG. 2 is a perspective diagram illustrating an example of an electronic device.

Referring to FIG. 2, an electronic device may be a smartphone 1100. A motherboard 1110 may be accommodated in the smartphone 1100, and various components 1120 may be physically or electrically connected to the motherboard 1110. Also, other components that may or may not be physically or electrically connected to the motherboard 1110, such as a camera module 1130 and/or the speaker 1140, may be accommodated in a body of the electronic device. A portion of the components 1120 may be the chip related components, such as, for example, a component package 1121, but an example embodiment thereof is not limited thereto. The component package 1121 may have the form of a printed circuit board on which electronic components including active components and/or passive components are surface-mounted. Alternatively, the component package 1121 may be configured in the form of a printed circuit board in which active components and/or passive components are buried. The electronic device is not necessarily limited to the smartphone 1100, and may be other electronic devices as described above.

Printed Circuit Board

Figure 3:
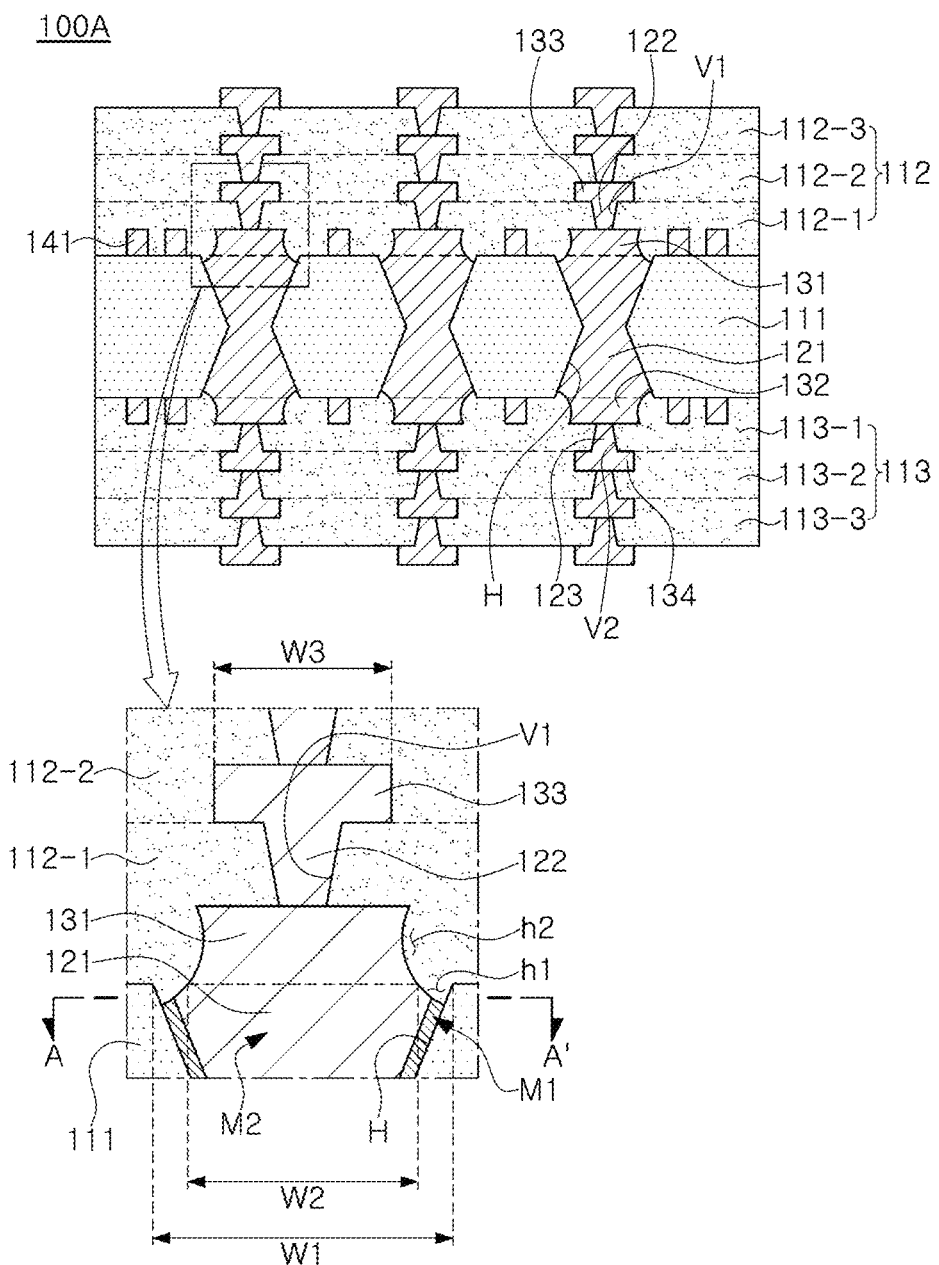
FIG. 3 is a cross-sectional diagram illustrating an example of a printed circuit board.

FIG. 3 is a cross-sectional diagram illustrating an example of a printed circuit board.

Figure 4:
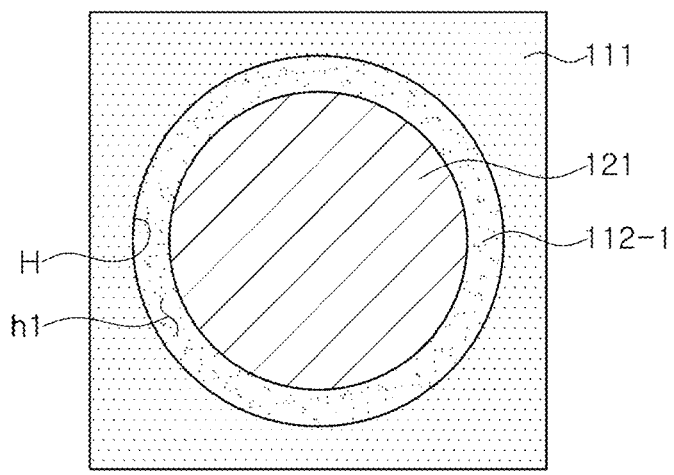
FIG. 4 is a cross-sectional diagram illustrating the printed circuit board illustrated in FIG. 3 taken along line A-A'.

FIG. 4 is a cross-sectional diagram illustrating the printed circuit board illustrated in FIG. 3 taken along line A-A'.

Referring to the drawings, the printed circuit board 100A according to an example embodiment may include a first insulating layer 111, a through-hole H penetrating a region between upper and lower surfaces of the first insulating layer 111, a first via 121 filling at least a portion of the through-hole H, a first pad 131 connected to an upper side of the first via 121, and a second pad 132 connected to a lower side of the first via 121. Also, a trace 141 disposed on an upper surface and/or a lower surface of the first insulating layer 111 may be further included.

The diameter (or the width) W1 of the through-hole H on the uppermost side may be larger than the width W2 of the first pad 131, and accordingly, the planar area of the through-hole H on the uppermost side may be larger than the planar area of the first pad 131. Similarly, the diameter of the through-hole H on a lowermost side may be greater than the width of the second pad 132, and accordingly, the planar area of the through-hole H on a lowermost side may be larger than the planar area of the second pad 132. In this case, as the size of the first pad 131 and/or the second pad 132 decreases, integration density of the through-holes H may improve and the area of the substrate may be reduced. Also, by disposing the traces 141 in the region in which the size of the first pad 131 and/or the second pad 132 is reduced, the number of substrate layers may be reduced.

In example embodiments, the diameter and width may be measured using a scanning microscope or an optical microscope based on the grinding or cutting cross-section of the printed circuit board in the vertical direction. When the diameter and width in the cross-section are not constant, the maximum diameter and maximum width may be used as the diameter and width. When an object such as a through-hole is formed in a polygonal shape other than a circular shape or an elliptical shape on a plane, the diameter may be replaced with the width.

In example embodiments, the planar area may be measured using a scanning microscope or an optical microscope based on the grinding or cutting cross-section of the printed circuit board in the horizontal direction. When the planar area in the cross-section is not constant, the maximum planar area may be used as the planar area. Alternatively, the planar area may refer to an area when viewed from above or below.

In example embodiments, the horizontal direction may be any direction on a plane, and the vertical direction may be an upper or lower direction perpendicular to the horizontal direction on a cross-section. Here, the shape on a cross-sectional may refer to a cross-sectional shape when the object is vertically cut, or a cross-sectional shape when the object is viewed from the side, and the shape on a plane may refer to the shape when the object is horizontally cut, or a planar shape when the object is viewed from the above or below.

At least a portion of the upper surface of the first via 121 exposed from the first pad 131 may be recessed lower than the upper surface of the first insulating layer 111. Similarly, at least a portion of the lower surface of the first via 121 exposed from the second pad 132 may be recessed above the lower surface of the first insulating layer 111. In this case, the recessed space may be filled with a second insulating layer 112 and/or a third insulating layer 113, which will be described later, such that the contact area of the first via 121 with the insulating material may improve such that connection reliability may further improve.

A first groove portion h1 surrounding the first pad 131 may be formed in the upper region of the through-hole H by the recess of the upper surface of the first via 121, and at least a portion of a side surface of the first pad 131 may be recessed inwardly such that a second groove portion h2 connected to the first groove portion h1 may be formed in the side portion of the first pad 131. The first and second groove portions h1 and h2 may have a rounded shape in a cross-section of the printed circuit board in the vertical direction. Similarly, a third groove portion surrounding the second pad 132 may be formed in the lower region of the through-hole H by the recess of the lower surface of the first via 121, and at least a portion of a side surface of the second pad 132 may be recessed inwardly such that a fourth groove portion connected to the third groove portion may be formed in the side portion of the second pad 132. The third and fourth groove portions may also have a rounded shape in the cross-section of the printed circuit board in the vertical direction. In this case, the size of the first pad 131 and/or the second pad 132 may be further reduced. Also, connection reliability of the first via 121 as well as the first pad 131 and/or the second pad 132 may further improve.

The first via 121 may be integrated with the first and second pads 131 and 132 without boundaries therebetween. In this case, the first via 121 and the first pad 131 may be separated from each other based on the extension line of the upper surface of the first insulating layer 111. The first via 121 and the second pad 132 may be separated from each other based on the extension line of the lower surface of the first insulating layer 111. The first via 121 and the first and second pads 131 and 132 may be formed by the same plating process. For example, the first via 121 may include a first metal layer M1 disposed on a wall surface of the through-hole H and a second metal layer M2 disposed on the first metal layer M1 and filling at least a portion of the through-hole H, and the first and second pads 131 and 132 may include a second metal layer M2. That is, each of the first via 121 and the first and second pads 131 and 132 may include the second metal layer M2 in common. The first metal layer M1 may be a seed layer such as an electroless plating layer, and the second metal layer M2 may be an electrolytic plating layer, but an example embodiment thereof is not limited thereto.

If desired, the printed circuit board 100A according to an example embodiment may further include a second insulating layer 112 disposed on the upper surface of the first insulating layer 111, a third insulating layer 113 disposed on the lower surface of the first insulating layer 111, a third pad 133 disposed on or in the second insulating layer 112, a fourth pad 134 disposed on or in the third insulating layer 113, a second via 122 disposed in the second insulating layer 112 and connected to the third pad 133, and/or a third via disposed in the third insulating layer 113 and connected to the fourth pad 134.

The diameter (or width) W1 of the through-hole H on the uppermost side may be greater than the width W2 of the first pad 131, and the width W2 of the first pad 131 may be larger than the width W3 of the most adjacent third pad connected through the second via 122. Similarly, the diameter (or width) of the lowermost side of the through-hole H may be greater than the width of the second pad 132, and the width of the second pad 132 may be greater than the width of the most adjacent fourth pad 134 connected through the third via 123. In this case, the size of the first pad 131 and/or the second pad 132 may be prevented from excessively decreasing. In one example, the width W2 of the first pad 131 may refer to a width of the first pad 131 on the extension line of the upper surface of the first insulating layer 111 in the cross-section of the printed circuit board in the vertical direction. Accordingly, an alignment margin during the build-up process may be sufficiently secured.

Hereinafter, the components of the printed circuit board 100A according to an example embodiment will be described in greater detail with reference to the drawings.

The first insulating layer 111 may be a core insulating layer. The first insulating layer 111 may include an insulating material. As an insulating material, a thermosetting resin such as an epoxy resin, a thermoplastic resin such as polyimide, or a material in which these resins are mixed with an inorganic filler such as silica, or a resin impregnated in a core material such as glass fiber (glass fiber, glass cloth, glass fabric) together with an inorganic filler, such as, for example, an Ajinomoto build-up film (ABF), prepreg, or the like, may be used, but an example embodiment thereof is not limited thereto. The first insulating layer 111 may have a thickness greater than thicknesses of a plurality of first build-up insulating layers 112-1, 112-2, and 112-3 and a plurality of second build-up insulating layers 113-1, 113-2, and 113 to be described later.

In example embodiments, the thickness may be measured using a scanning microscope or an optical microscope based on the grinding or cutting cross-section of the printed circuit board in the vertical direction. When the thickness is not constant, the thicknesses may be compared using average values of the thickness of portions measured at five arbitrary points.

The second and third insulating layers 112 and 113 may be build-up insulating layers. The second and third insulating layers 112 and 113 may include a plurality of first and second build-up insulating layers 112-1, 112-2, 112-3, 113-1, 113-2, and 113-3. Each of the first and second buildup insulating layers 112-1, 112-2, 112-3, 113-1, 113-2, and 113-3 may include an insulating material. As an insulating material, a thermosetting resin such as an epoxy resin, a thermoplastic resin such as polyimide, or a material in which these resins are mixed with an inorganic filler such as silica, or a resin impregnated in a core material such as glass fiber together with an inorganic filler, such as, for example, an Ajinomoto build-up film (ABF), prepreg, or the like, may be used, but an example embodiment thereof is not limited thereto. The plurality of first build-up insulating layers 112-1, 112-2, and 112-3 may be integrated with or separated from each other without boundaries therebetween, and the number of the laminated layers may be larger or smaller than the examples illustrated in the drawings. The plurality of second build-up insulating layers 113-1, 113-2, and 113-3 may be integrated or separated from each other without boundaries therebetween, and the laminated layers may be larger or smaller than the examples illustrated in the drawings.

The through-hole H may penetrate through a region between the upper and lower surfaces of the first insulating layer 111. Diameters of the through-hole H on uppermost and lowermost sides may be larger than the diameter of the through-hole H on the central side between the uppermost and lowermost sides. For example, the through-hole H may have an hourglass shape in which the width thereof may decrease and increase in the cross-section. However, an example embodiment thereof is not limited thereto, and the shape of the through-hole H may be varied. At least a portion of each of the inorganic fillers and/or glass fibers included in the first insulating layer 111 may protrude from the wall surface of the through-hole H, but an example embodiment thereof is not limited thereto.

The first and second via holes V1 and V2 may penetrate a plurality of first and second build-up insulating layers 112-1, 112-2, 112-3, 113-1, 113-2, and 113-3 in the thickness direction. Here, the holes may penetrate to each pad. Each of the first via holes V1 may have a diameter on the uppermost side greater than a diameter on the lowermost side. For example, each of the first via holes V1 may have a tapered shape in cross-section. Each of the second via holes V2 may have a greater diameter on a lowermost side than a diameter on the uppermost side. For example, each of the second via holes V2 may have a tapered shape, tapered in a direction opposite to each of the first via holes V1 on a cross-section. However, an example embodiment thereof is not limited thereto, and the shapes of the first and second via holes V1 and V2 may be varied.

The first via 121 may include a metal material. The metal material may include copper (Cu), aluminum (Al), silver (Ag), tin (Sn), gold (Au), nickel (Ni), lead (Pb), titanium (Ti), and/or alloys thereof. The first via 121 may perform various functions according to a design. For example, the first via 121 may include a through-via for signal connection, a through-via for ground connection, and a through-via for power connection. The number of the first vias 121 is not limited to any particular example and a plurality of first vias 121 may be provided. The first via 121 may include an electroless plating layer (or chemical copper) and an electrolytic plating layer (or electrolytic copper).

The second and third vias 122 and 123 may include a metal material. The metal material may include copper (Cu), aluminum (Al), silver (Ag), tin (Sn), gold (Au), nickel (Ni), lead (Pb), titanium (Ti), and/or alloys thereof. The second and third vias 122 and 123 may perform various functions according to a design. For example, the second and third vias 122 and 123 may include a connection via for signal connection, a connection via for ground connection, and a connection via for power connection. The number of the second and third vias 122 and 123 is not limited to any particular example, and a plurality of second and third vias 122 and 123 may be disposed on each of the first and second build-up insulating layers 112-1, 112-2, 112-3, 113-1, 113-2, and 113-3. The second and third vias 122 and 123 may include an electroless plating layer (or chemical copper) and an electrolytic plating layer (or electrolytic copper).

The first via 121 filling at least a portion of the through-hole H penetrating through the first insulating layer 111 may be a through-via. The second vias 122 filling at least a portion of the first via holes V1 penetrating through the plurality of first buildup insulating layers 112-1, 112-2, and 112-3 may be first connection vias. The third vias 123 filling at least a portion of the second via holes V2 penetrating through the plurality of second buildup insulating layers 113-1, 113-2 and 113-3 may be second connection vias. Accordingly, the first via 121 may have a height greater than that of each of the second via 122 and the third via 123.

Each of the first and second pads 131 and 132 may include a metal material. The metal material may include copper (Cu), aluminum (Al), silver (Ag), tin (Sn), gold (Au), nickel (Ni), lead (Pb), titanium (Ti), and/or alloys thereof. The first and second pads 131 and 132 may perform various functions according to a design of the corresponding layer. For example, the first and second pads 131 and 132 may include a ground pad, a power pad, a signal pad, and the like. The number of each of the first and second pads 131 and 132 may be two or more. Each of the first and second pads 131 and 132 may include an electrolytic plating layer (or electrolytic copper).

Each of the third and fourth pads 133 and 134 may include a metal material. The metal material may include copper (Cu), aluminum (Al), silver (Ag), tin (Sn), gold (Au), nickel (Ni), lead (Pb), titanium (Ti), and/or alloys thereof. The third and fourth pads 133 and 134 may perform various functions according to a design of the corresponding layer. For example, the third and fourth pads 133 and 134 may include a ground pad, a power pad, and a signal pad. The number of the third and fourth pads 133 and 134 is not limited to any particular example, and a plurality of the third and fourth pads 133 and 134 may be disposed on the first and second build-up insulating layers 112-1, 112-2, 112-3, 113-1, 113-2, and 113-3. The third and fourth pads 133 and 134 may include an electroless plating layer (or chemical copper) and an electrolytic plating layer (or electrolytic copper). If desired, a copper foil may be further included.

The trace 141 may include a metal material. The metal material may include copper (Cu), aluminum (Al), silver (Ag), tin (Sn), gold (Au), nickel (Ni), lead (Pb), titanium (Ti), and/or alloys thereof. The trace 141 may include a trace for a signal. A plurality of the traces 141 may be provided. The trace 141 may include an electroless plating layer (or chemical copper) and an electrolytic plating layer (or electrolytic copper). If desired, the trace 141 may further include a copper foil. The trace 141 may be a microcircuit having a small line/space, and for example, the line width of the trace 141 may be smaller than the width of the first pad 131 and/or the second pad 132.

In example embodiments, the line width may be measured using a scanning microscope or an optical microscope based on the grinding or cutting cross-section of the printed circuit board in the vertical direction. When the line width in the cross-section is not constant, the line width may refer to a value measured as the maximum line width.

The first and second build-up insulating layers 112-1, 112-2, 112-3, 113-1, 113-2, and 113-3 may further include other line patterns, plane patterns, and/or pad patterns in addition to the third and fourth pads 133 and 134. Each of these patterns may include a metal material. The metal material may include copper (Cu), aluminum (Al), silver (Ag), tin (Sn), gold (Au), nickel (Ni), lead (Pb), titanium (Ti), and/or alloys thereof. Each of these patterns may perform various functions depending on a design of the corresponding layer. For example, the pattern may include a ground pattern, a power pattern, and a signal pattern. Each of these patterns may include an electroless plating layer (or chemical copper) and an electrolytic plating layer (or electrolytic copper). If desired, the patterns may further include a copper foil.

A resist layer may be further disposed on each of the second and third insulating layers 112 and 113. The resist layer may be disposed on the outermost side of the printed circuit board 100A and may protect internal components. The material of the resist layer is not limited to any particular example. For example, an insulating material may be used, and in this case, a solder resist may be used as the insulating material, but an example embodiment thereof is not limited thereto. A plurality of openings for opening at least a portion of each pattern such as a pad may be formed in the resist layer.

FIGS. 5 to 10 are process diagrams illustrating an example of manufacturing a through-via and first and second pads formed in the core insulating layer of the printed circuit board in FIG. 3

Figure 5:
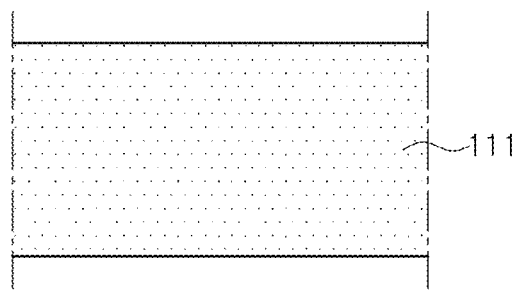
FIGS. 5 to 10 are process diagrams illustrating an example of manufacturing a through-via and first and second pads formed in the core insulating layer of the printed circuit board in FIG. 3.

Referring to FIG. 5, a first insulating layer 111 may be prepared. The first insulating layer 111 may be a copper clad laminate (CCL). A copper foil may be disposed on the upper and/or lower surface of the first insulating layer 111, but an example embodiment thereof is not limited thereto.

Figure 6:
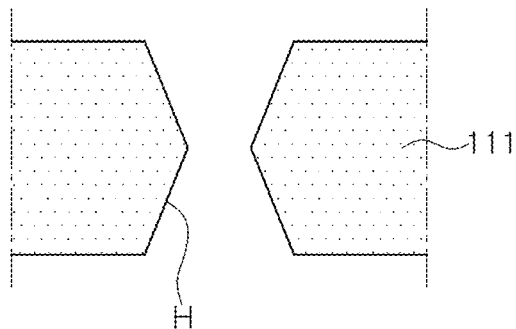

Referring to FIG. 6, a through-hole H may be formed in the first insulating layer 111. The through-hole H may be formed by laser processing. For example, by performing processing in both the upper and lower directions of the first insulating layer 111 using laser processing, such as, for example, a $CO_2$ drill, an hourglass-shaped through-hole H penetrating a region between the upper and lower surfaces of the first insulating layer 111 may be formed. If desired, processing may be performed only in the upper or lower direction such that a through-hole H having a tapered shape may be formed.

Figure 7:
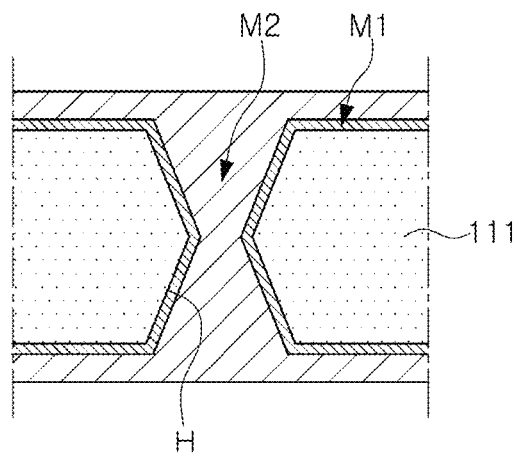

Referring to FIG. 7, first and second metal layers M1 and M2 may be formed in the first insulating layer 111 and the through-hole H. For example, the first metal layer M1 may be formed on the wall surface of the through-hole H and the upper and lower surfaces of the first insulating layer 111 by electroless plating. Thereafter, the second metal layer M2 may be formed on the first metal layer M1 by electroplating using the first metal layer M1 as a seed layer. The second metal layer M2 may fill the through-hole H.

Figure 8:
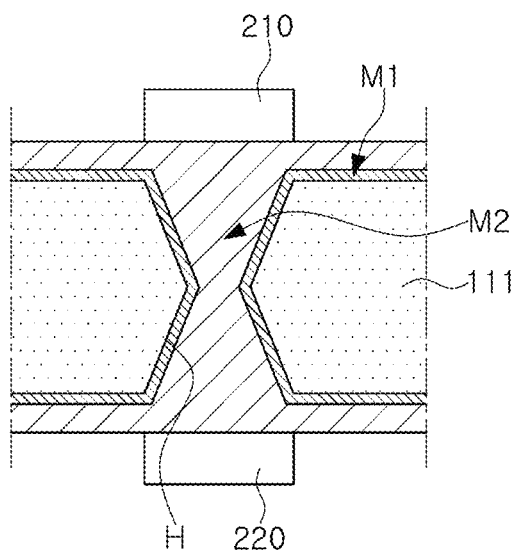

Referring to FIG. 8, first and second etching resists 210 and 220 may be disposed on the second metal layer M2 above and below the through-hole H, respectively. Each of the first and second etching resists 210 and 220 may be a dry film patternable by a photolithography process.

Figure 9:
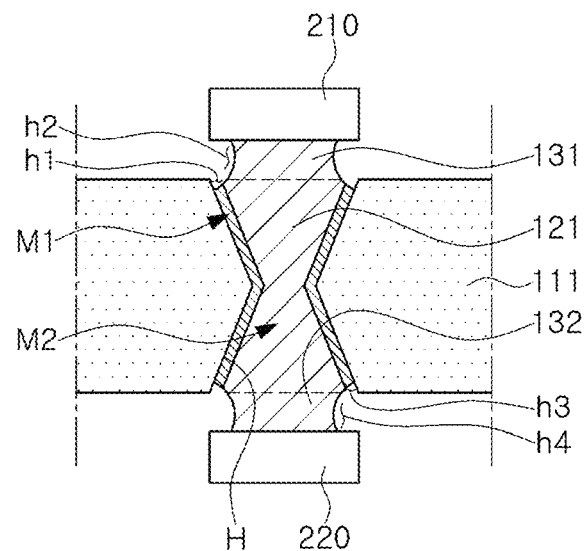

Referring to FIG. 9, an etching process may be performed on the first and second metal layers M1 and M2 using the first and second etching resists 210 and 220 as masks. For example, through an isotropic etching process by a tenting process, the first and third groove portions h1 and h3 may be formed in the upper and lower regions of the through-hole H, respectively, and second and fourth groove portions h2 and h4 may be formed in the side portions of the first and second pads 131 and 132, respectively. The first and second groove portions h1 and h2 and the third and fourth groove portions h3 and h4 may be etched in a rounded shape, respectively.

Figure 10:
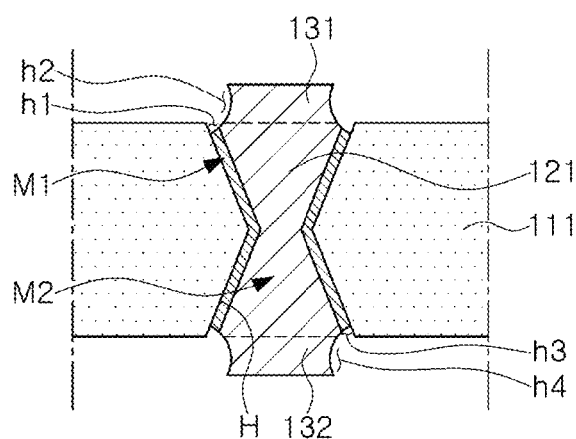

Referring to FIG. 10, the first and second etching resists 210 and 220 may be removed. A resist stripper may be used to remove the first and second etching resists 210 and 220, but an example embodiment thereof is not limited thereto, and physical stripping may be performed. Through a series of processes, the first via 121 as a through-via and the first and second pads 131 and 132 as the pads of the through-via may be formed in the first insulating layer 111 which is the core insulating layer. Thereafter, by performing the build-up process, the printed circuit board 100A according to the above-described example embodiment may be manufactured. The other descriptions are substantially the same as those described in the aforementioned example embodiment, and overlapping descriptions will not be provided.

Figure 11:
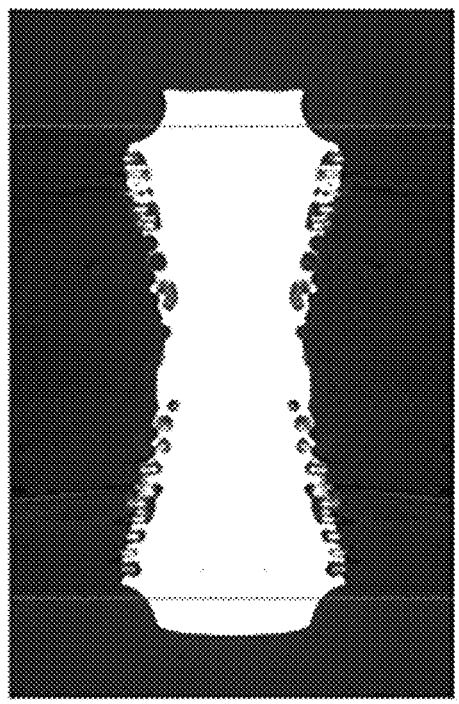
FIG. 11 is cross-sectional images of comparison between a through-via and pads thereof according to an example embodiment and a through-via and pads not according to an example embodiment.
Figure 11:
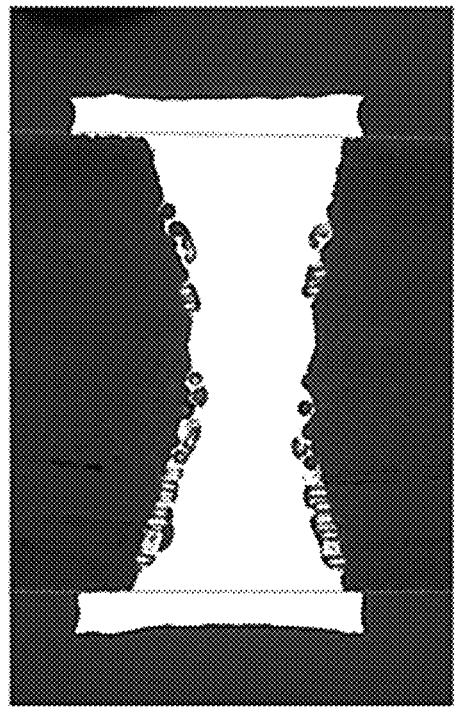

FIG. 11 is cross-sectional images of comparison between a through-via and pads thereof according to an example embodiment and a through-via and pads not according to an example embodiment.

Referring to the drawings, in the example as in (a), the pads for through-vias may be formed in a relatively small size, the sides of the pads for through-vias may be partially etched to have a rounded shape, and the upper and lower surfaces of the through-via may be partially etched to have a rounded shape, such that there may be a recess step with the upper and lower surfaces of the core insulating layer. When the through-via and the pads thereof are formed by a general plating process as in (b), the through-via pads may be formed in a relatively large size, and the through-via may not have a recess step. Accordingly, there may be a difference in effectiveness in terms of integration density or reliability. Meanwhile, in the drawings, the dotted line may be an extension line indicating the level of the upper surface and the lower surface of the core insulating layer.

Figure 12:
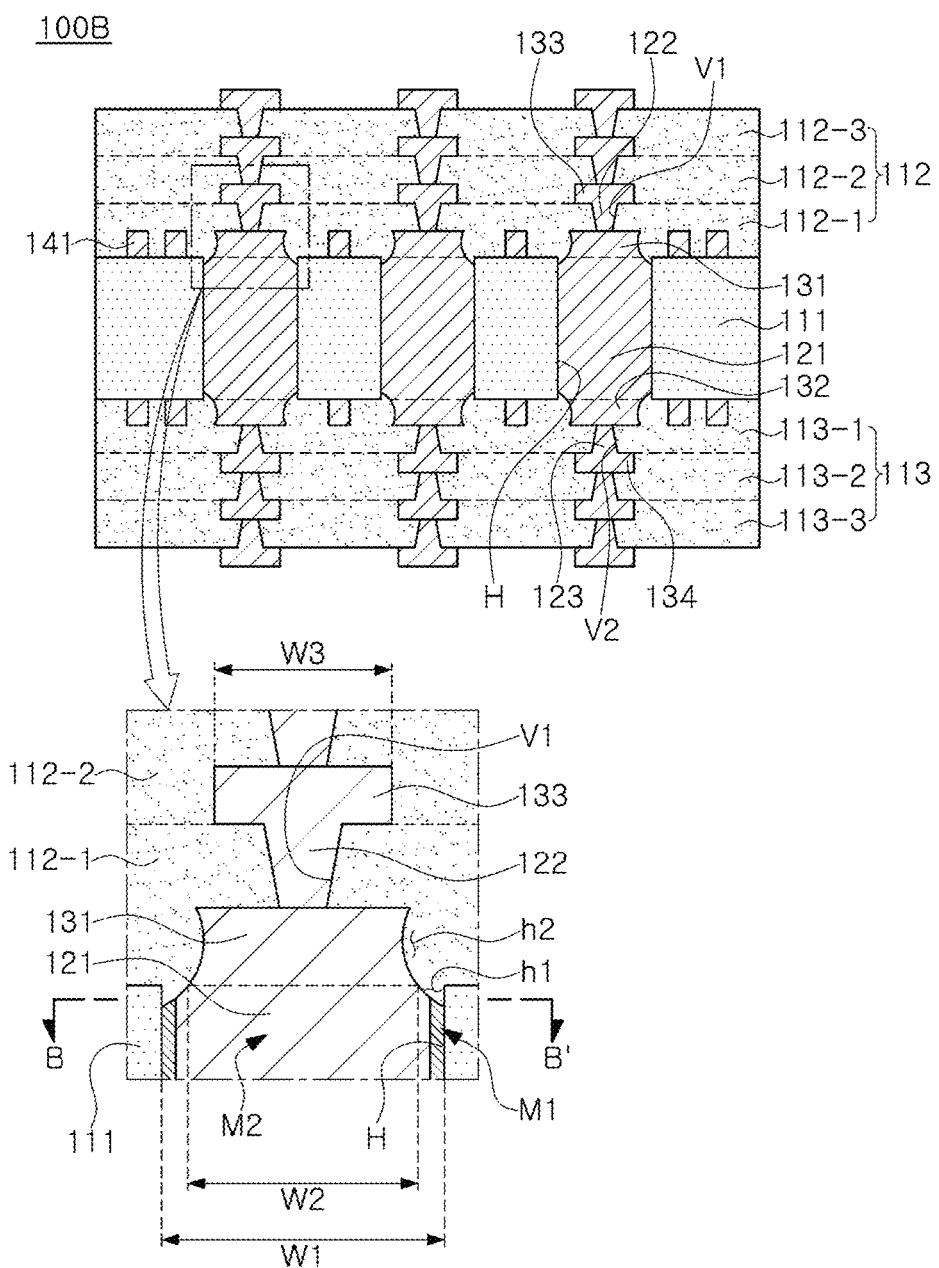
FIG. 12 is a cross-sectional diagram illustrating another example of a printed circuit board.

FIG. 12 is a cross-sectional diagram illustrating another example of a printed circuit board.

Figure 13:
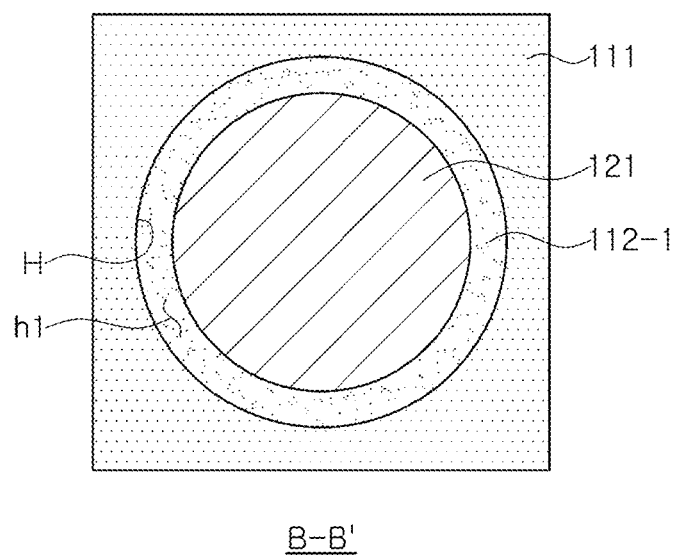
FIG. 13 is a cross-sectional diagram illustrating the printed circuit board illustrated in FIG. 12 taken along line B-B'.

FIG. 13 is a cross-sectional diagram illustrating the printed circuit board illustrated in FIG. 12 taken along line B-B'.

Referring to the drawings, in the printed circuit board 100B according to another example embodiment, shapes of the through-holes H may be different as compared to the printed circuit board 100A according to the above-described example embodiment. For example, the diameter of the through-hole H on the uppermost side and the lowermost side may be substantially the same as the diameter of the through-hole H on the central side between the uppermost side and the lowermost side. For example, the through-hole H may have a rectangular shape having a substantially constant width in a cross-section. The through-hole H may be formed using a mechanical drill. The other descriptions are substantially the same as those described in the aforementioned example embodiment, and overlapping descriptions will not be provided.

According to the aforementioned example embodiments, a printed circuit board which may, by increasing integration density, reduce an area and the number of layers may be provided.

Also, a printed circuit board which may improve reliability of a through-via formed in a core insulating layer may be provided.

In the present disclosure, the example embodiments may include process errors, positional deviations, and measurement errors occurring in the process. For example, the configuration in which components are substantially the same may include the example in which the components are completely the same, and also the example in which a slight difference due to a process error may be present. Also, the configuration in which elements are substantially constant may include the example in which the elements are completely constant, and also the example in which a minute difference may be generated due to a process error.

In the example embodiments, the term "connected" may not only refer to "directly connected" but also include "indirectly connected" by may refer to of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, and may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

An expression used in the singular encompasses the expression of the plural, unless it has a clearly different meaning in the context.

While the example embodiments have been illustrated and described above, it will be apparent to those skilled in the art that modifications and variations could be made without departing from the scope of the present invention as defined by the appended claims.

What is claimed is:

1. A printed circuit board, comprising:
a first insulating layer;
a through-hole penetrating a region between an upper surface and a lower surface of the first insulating layer;
a first via disposed in at least a portion of the through-hole;
a first pad connected to an upper side of the first via; and
a second pad connected to a lower side of the first via,
wherein a width of the through-hole on an uppermost side is greater than a width of the first pad, and
wherein at least a portion of an upper surface of the first via exposed from the first pad is recessed below the upper surface of the first insulating layer.

2. The printed circuit board of claim 1, wherein a planar area of the through-hole on the uppermost side is larger than a planar area of the first pad.

3. The printed circuit board of claim 1,
wherein the at least portion of the upper surface of the first via exposed from the first pad is recessed downwardly to have a first groove portion in an upper region of the through-hole, and
wherein the first groove portion surrounds the first pad.

4. The printed circuit board of claim 3,
wherein at least a portion of a side surface of the first pad is recessed inwardly such that a side portion of the first pad has a second groove portion, and
wherein the first and second groove portions are connected to each other and have a rounded shape.

5. The printed circuit board of claim 1,
wherein a width of the through-hole on a lowermost side is greater than a width of the second pad, and
wherein at least a portion of a lower surface of the first via exposed from the second pad is recessed above the lower surface of the first insulating layer.

6. The printed circuit board of claim 5,
wherein the at least portion of the lower surface of the first via exposed from the second pad is recessed upwardly to have a third groove portion in a lower region of the through-hole, and
wherein the third groove portion surrounds the second pad.

7. The printed circuit board of claim 6,
wherein at least a portion of a side surface of the second pad is recessed inwardly such that a side portion of the second pad has a fourth groove portion, and
wherein the third and fourth groove portions are connected to each other and have a rounded shape.

8. The printed circuit board of claim 1, wherein the first via is integrated with the first and second pads without boundaries therebetween.

9. The printed circuit board of claim 8,
wherein the first via includes a first metal layer disposed on a wall surface of the through-hole and a second metal layer disposed on the first metal layer, and
wherein each of the first and second pads includes a material of the second metal layer.

10. The printed circuit board of claim 1, wherein a width of the through-hole on the uppermost side and a lowermost side is larger than a width of the through-hole on a central side between the uppermost and lowermost sides.

11. The printed circuit board of claim 1, wherein a width of the through-hole on the uppermost side and a lowermost side is the same as a width of the through-hole on a central side between the uppermost and lowermost sides.

12. The printed circuit board of claim 1, further comprising:
a trace disposed on the upper surface of the first insulating layer,
wherein a line width of the trace is smaller than the width of the first pad.

13. The printed circuit board of claim 1, further comprising:
a second insulating layer disposed on the upper surface of the first insulating layer;
a third pad disposed on or in the second insulating layer;
a second via disposed in the second insulating layer and connected to the third pad;
a third insulating layer disposed on the lower surface of the first insulating layer;
a fourth pad disposed on or in the third insulating layer; and
a third via disposed in the third insulating layer and connected to the fourth pad.

14. A printed circuit board, comprising:
a core insulating layer;
a through-via disposed in at least a portion of a through-hole penetrating through the core insulating layer;
a first pad connected to an upper side of the through-via;
a second pad connected to a lower side of the through-via;
a first build-up insulating layer disposed on an upper surface of the core insulating layer and covering at least a portion of the first pad;
a first connection via disposed in at least a portion of a first via hole penetrating through the first build-up insulating layer; and
a third pad connected to an upper side of the first connection via,
wherein a width of the through-hole on the uppermost side is greater than a width of the first pad, and
wherein the width of the first pad is greater than a width of the third pad.

15. The printed circuit board of claim 14,
wherein a thickness of the core insulating layer is greater than a thickness of the first build-up insulating layer, and
wherein a height of the through-via is greater than a height of the first connection via.

16. The printed circuit board of claim 14, further comprising:
- a second build-up insulating layer disposed on a lower surface of the core insulating layer and covering at least a portion of the second pad;
- a second connection via disposed in at least a portion of a second via hole penetrating through the second build-up insulating layer; and
- a fourth pad connected to a lower side of the second connection via,
- wherein a width of the through-hole on a lowermost side is greater than a width of the second pad, and
- wherein the width of the second pad is greater than a width of the fourth pad.

17. A printed circuit board, comprising:
- a first insulating layer;
- a hole penetrating a region between an upper surface and a lower surface of the first insulating layer;
- a first via disposed in at least a portion of the hole; and
- a first pad disposed on the first via,
- wherein on the upper surface of the first insulating layer, a width of the first pad is the same as a width of the first via and less than a width of the hole.

18. The printed circuit board of claim 17, wherein a central portion of the first pad in a thickness direction of the first pad is less than the width of the first pad on the upper surface of the first insulating layer.

19. The printed circuit board of claim 17, further comprising:
- a second pad connected to a lower side of the first via,
- wherein on the lower surface of the first insulating layer, a width of the second pad is the same as a width of the first via and less than a width of the hole.

20. The printed circuit board of claim 19, wherein a central portion of the second pad in a thickness direction of the second pad is less than the width of the second pad on the lower surface of the first insulating layer.

21. The printed circuit board of claim 17, further comprising:
- a second insulating layer disposed on the upper surface of the first insulating layer;
- a third pad disposed on or in the second insulating layer; and
- a second via disposed in the second insulating layer and connecting to the third pad and the first pad to each other.

22. The printed circuit board of claim 21, wherein the second insulating layer is disposed in a portion of the hole.

* * * * *